(12) United States Patent
Fujita

(10) Patent No.: US 11,935,739 B2
(45) Date of Patent: Mar. 19, 2024

(54) SUBSTRATE PROCESSING APPARATUS AND SUBSTRATE PROCESSING METHOD

(71) Applicant: Tokyo Electron Limited, Tokyo (JP)

(72) Inventor: Akira Fujita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 22 days.

(21) Appl. No.: 17/024,065

(22) Filed: Sep. 17, 2020

(65) Prior Publication Data

US 2021/0098249 A1 Apr. 1, 2021

(30) Foreign Application Priority Data

Sep. 27, 2019 (JP) ................................. 2019-177660

(51) Int. Cl.
| | | |
|---|---|---|
| *H01L 21/02* | (2006.01) | |
| *B05D 1/02* | (2006.01) | |
| *B08B 3/02* | (2006.01) | |
| *H01L 21/306* | (2006.01) | |
| *H01L 21/67* | (2006.01) | |

(52) U.S. Cl.
CPC .......... *H01L 21/02087* (2013.01); *B05D 1/02* (2013.01); *B08B 3/02* (2013.01); *H01L 21/30604* (2013.01); *H01L 21/6708* (2013.01)

(58) Field of Classification Search
None
See application file for complete search history.

(56) References Cited

U.S. PATENT DOCUMENTS

| 4,655,162 A * | 4/1987 | Kameyama ......... H01L 21/6715 |
| | | 118/54 |
| 2003/0072886 A1* | 4/2003 | Ito .......................... G03F 7/162 |
| | | 430/935 |
| 2014/0261569 A1* | 9/2014 | Fonseca ............ H01L 21/67051 |
| | | 134/30 |

FOREIGN PATENT DOCUMENTS

| JP | H10-209143 A | 8/1998 |
| JP | 2002-233832 A | 8/2002 |
| JP | 2003-086567 A | 3/2003 |
| JP | 2013-153135 A | 8/2013 |
| JP | 2014086638 A | 5/2014 |
| JP | 2018-142678 A | 9/2018 |

* cited by examiner

*Primary Examiner* — Michael P. Rodriguez
(74) *Attorney, Agent, or Firm* — Nath, Goldberg & Meyer; Jerald L. Meyer; Tanya E. Harkins

(57) ABSTRACT

A substrate processing apparatus includes a substrate holder configured to hold a substrate, a rotary driver configured to rotate the substrate holder around a rotation axis, a processing liquid nozzle configured to eject a processing liquid toward a peripheral portion of the substrate, and a gas nozzle configured to eject a gas toward the processing liquid from a time at which the processing liquid is ejected from an ejection port of the processing liquid nozzle until a time at which the processing liquid arrives at a liquid arrival point on the substrate.

19 Claims, 13 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2019-177660, filed on Sep. 27, 2019, the entire contents of which are incorporated herein by reference.

TECHNICAL FIELD

The present disclosure relates to a substrate processing apparatus and a substrate processing method.

BACKGROUND

In the manufacture of a semiconductor device, a step of removing an unnecessary film on a peripheral portion of a circular substrate, such as a semiconductor wafer, through wet etching with a chemical liquid (called "bevel etching") is performed. Patent Document 1 discloses an apparatus for performing the bevel etching. The bevel-etching apparatus disclosed in Patent Document 1 includes a vacuum chuck configured to hold a substrate in a horizontal position and to rotate the substrate about a vertical axis, and a nozzle configured to supply a chemical for etching to the peripheral portion of the rotating substrate. In addition, the bevel-etching apparatus disclosed in Patent Document 1 includes a ring-shaped protective wall for preventing the processing liquid, which has been supplied to the substrate and then scattered (separated) from the substrate, from being re-adhered to the substrate.

PRIOR ART DOCUMENT

Patent Document

Patent Document 1: Japanese Laid-Open Patent Publication No. 2014-086638

SUMMARY

According to embodiments of the present disclosure, there is provided a substrate processing apparatus including: a substrate holder configured to hold a substrate; a rotary driver configured to rotate the substrate holder around a rotation axis; a processing liquid nozzle configured to eject a processing liquid toward a peripheral portion of the substrate; and a gas nozzle configured to eject a gas toward the processing liquid from a time at which the processing liquid is ejected from an ejection port of the processing liquid nozzle until a time at which the processing liquid arrives at a liquid arrival point on the substrate.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of a substrate processing apparatus will be described with reference to the accompanying drawings.

Figure 1:
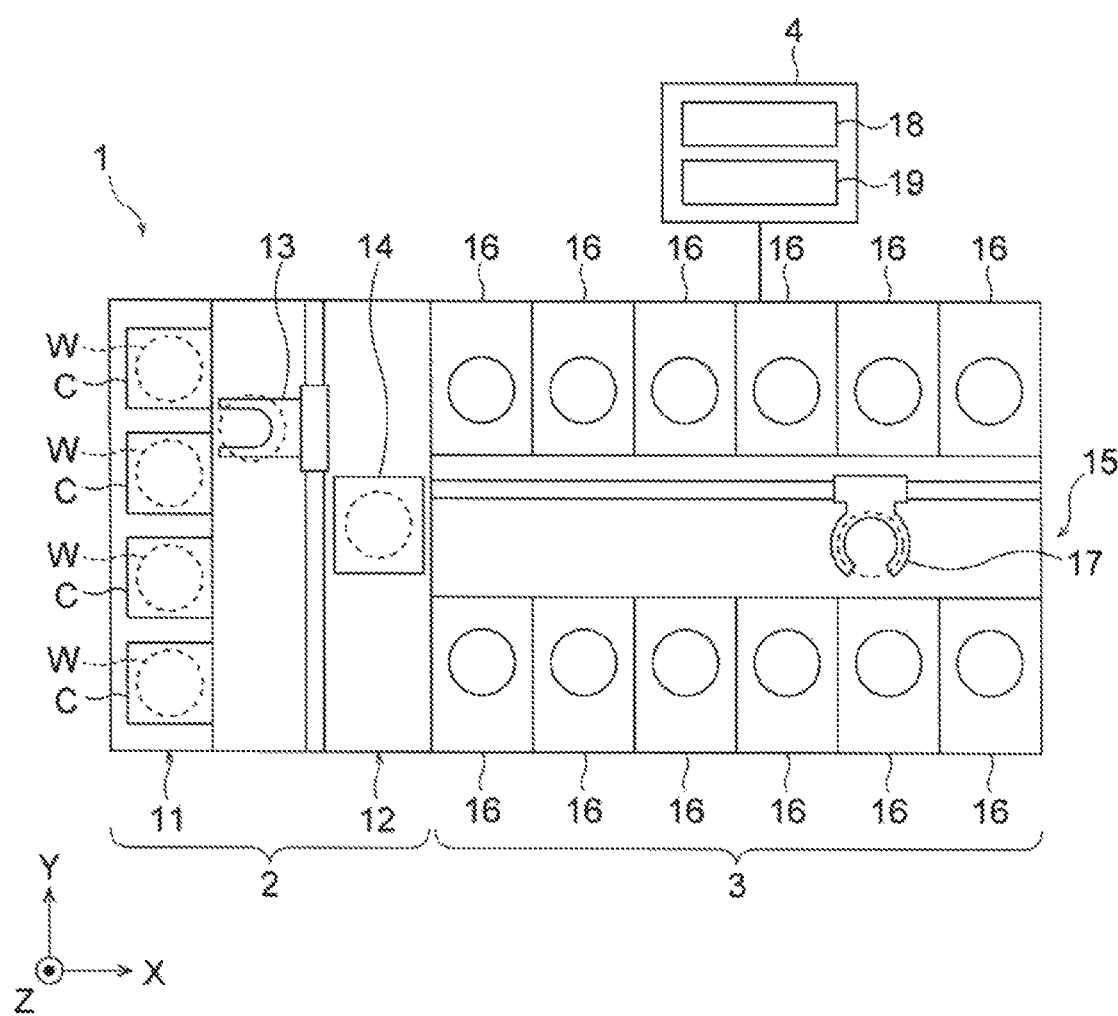
FIG. 1 is a schematic horizontal cross-sectional view of a substrate processing apparatus according to an embodiment.

FIG. 1 is a schematic view illustrating a configuration of a substrate processing system according to an embodiment. In the following description, in order to clarify positional relationships, the X axis, the Y axis, and the Z axis, which are orthogonal to each other, are defined, and the positive direction of the Z axis is defined as a vertically upward direction.

As illustrated in FIG. 1, the substrate processing system 1 includes a loading/unloading station 2 and a processing station 3. The loading/unloading station 2 and the processing station 3 are provided adjacent to each other.

The loading/unloading station 2 includes a carrier placement part 11 and a transport part 12. A plurality of carriers C, each configured to accommodate a plurality of substrates, which are semiconductor wafers (hereinafter, referred to as "wafers W") in this embodiment, in a horizontal state, are placed in the carrier placement part 11.

The transport part 12 is provided adjacent to the carrier placement part 11, and includes therein a substrate transport apparatus 13 and a delivery part 14. The substrate transport apparatus 13 includes a wafer-holding mechanism configured to hold a wafer W. In addition, the substrate transport apparatus 13 is capable of moving in the horizontal direction and the vertical direction and rotating about the vertical axis, and thus transports a wafer W between a carrier C and the delivery part 14 using the wafer-holding mechanism.

The processing station 3 is provided adjacent to the transport part 12. The processing station 3 includes a transport part 15 and a plurality of processing units 16. The plurality of processing units 16 is arranged side by side on both sides of the transport part 15.

The transport part 15 includes therein a substrate transport apparatus 17. The substrate transport apparatus 17 includes a wafer-holding mechanism configured to hold a wafer W. In addition, the substrate transport apparatus 17 is capable of moving in the horizontal direction and the vertical direction and rotating about the vertical axis. The substrate transport apparatus 17 transports a wafer W between the delivery part 14 and a processing unit 16 using the wafer-holding mechanism.

The processing unit 16 performs predetermined substrate processing on the wafer W transported by the substrate transport apparatus 17.

Further, the substrate processing system 1 includes a control device 4. The control device 4 is, for example, a computer, and includes a controller 18 and a storage 19. In the storage 19, a program for controlling various kinds of processing executed in the substrate processing system 1 is stored. The controller 18 controls operations of the substrate processing system 1 by reading and executing the program stored in the storage 19.

In addition, such a program may be stored in a non-transitory computer-readable storage medium, and may be installed in the storage 19 of the control device 4 from the storage medium. The computer-readable storage medium includes, for example, a hard disk (HD), a flexible disk (FD), a compact disc (CD), a magneto-optical disc (MO), and a memory card.

In the substrate processing system 1 configured as described above, first, the substrate transport apparatus 13 of the loading/unloading station 2 takes out a wafer W from a carrier C placed on the carrier placement part 11 and places the wafer W that has been taken out on the delivery part 14. The wafer W placed on the delivery part 14 is moved from the delivery part 14 by the substrate transport apparatus 17 in the processing station 3, and is loaded into a processing unit 16.

After being processed by the processing unit 16, the wafer W loaded into the processing unit 16 is unloaded from the processing unit 16 and placed on the delivery part 14 by the substrate transport apparatus 17. Then, the processed wafer W placed on the delivery part 14 is returned to the carrier C in the carrier placement part 11 by the substrate transport apparatus 13.

Figure 2:
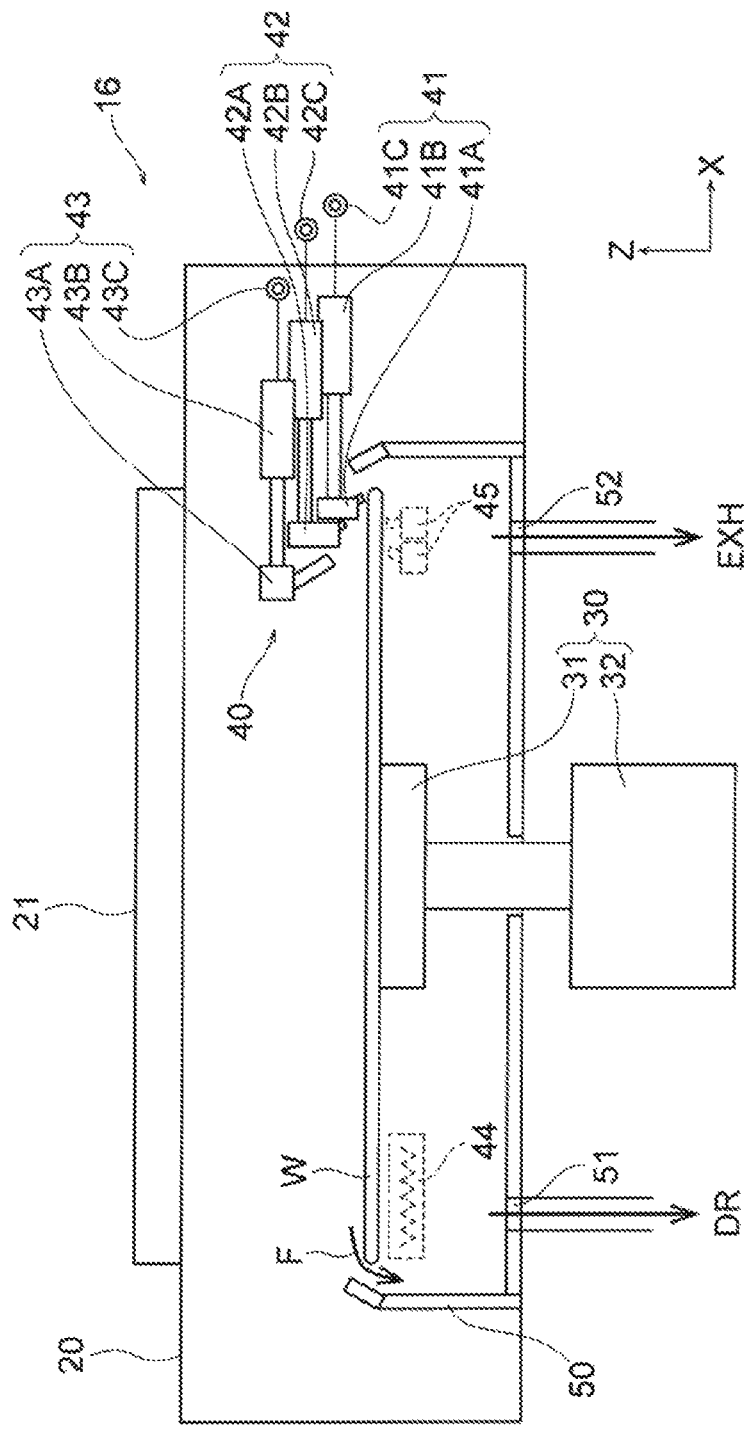
FIG. 2 is a schematic vertical cross-sectional view of a processing unit of the substrate processing apparatus of FIG. 1.

Next, the configuration of a processing unit 16 will be described with reference to FIG. 2. FIG. 2 is a schematic vertical cross-sectional view illustrating a configuration of the processing unit 16.

The processing unit 16 has a chamber (housing) 20, in which the substrate holding/rotating mechanism 30, the processing fluid supply 40, and the liquid-receiving cup 50 are housed. A ceiling portion of the chamber 20 is provided with a fan filter unit (FFU) 21. The FFU 21 forms a downward flow within the chamber 20.

The substrate holding/rotating mechanism 30 includes a substrate holder 31 configured to hold a wafer W in a horizontal orientation, and a rotary driver 32 configured to rotate the substrate holder 31 around a vertical axis (rotation axis). The substrate holder 31 is formed of a vacuum chuck configured to hold a wafer W by suctioning a central portion of a rear surface of the wafer W. The rotary driver 32 is formed of an electric motor, and an upper end of a rotary shaft of the electric motor is connected to the vacuum chuck. The wafer W can be rotated around the vertical axis by operating the electric motor.

The processing fluid supply 40 supplies a processing fluid, such as a processing liquid or a processing gas, to the peripheral portion of a wafer W. The processing fluid supply 40 has a chemical liquid supply 41, a rinsing liquid supply 42, and a gas supply 43.

The chemical liquid supply 41 has a chemical liquid nozzle 41A, a chemical liquid nozzle drive mechanism 41B, and a chemical liquid supply mechanism 41C. The chemical liquid nozzle drive mechanism 41B is configured to be capable of moving the chemical liquid nozzle 41A between a processing position (the position for supplying the chemical liquid to the wafer W) and a standby position, and to be capable of changing the orientation of the chemical liquid nozzle 41A (which will be described in detail below). The chemical liquid supply mechanism 41C supplies a chemical liquid (e.g., an etching liquid) to the chemical liquid nozzle 41A. Although not illustrated in detail, the chemical liquid supply mechanism 41C includes, for example, a factory power source, a pipe (pipe line) connected to a chemical liquid supply source such as a tank, and a flow control device (e.g., an opening/closing valve, a flow meter, or a flow rate control valve) interposed in the pipe.

The rinsing liquid supply 42 has a rinse nozzle 42A, a rinse nozzle drive mechanism 42B, and a rinsing liquid supply mechanism 42C. The rinse nozzle drive mechanism 42B is configured to be capable of moving the rinse nozzle 42A between a processing position (the position for supplying a rinsing liquid to the wafer W) and a standby position and to be capable of changing the orientation of the rinse nozzle 42A (which will be described in detail below). The rinsing liquid supply mechanism 42C supplies a rinsing liquid (e.g., DIW) to the rinse nozzle 42A. Although not illustrated in detail, the rinsing liquid supply mechanism 42C includes, for example, a factory power source, a pipe (pipe line) connected to a rinsing liquid supply source such as a tank, and a flow control device (e.g., an opening/closing valve, a flow meter, or a flow rate control valve) interposed in the pipe.

The gas supply 43 has a gas nozzle 43A, a gas nozzle drive mechanism 43B, and a gas supply mechanism 43C. The gas nozzle drive mechanism 43B is configured to be capable of moving the gas nozzle 43A between a processing position (the position for supplying gas to the wafer W) and a standby position, and to be capable of changing the orientation of the gas nozzle 43A (which will be described in detail below). The gas supply mechanism 43C supplies gas (e.g., nitrogen gas) to the gas nozzle 43A. Although not illustrated in detail, the gas supply mechanism 43C includes, for example, a factory power source, a pipe (pipe line) connected to a gas supply source such as a gas cylinder, and a flow control device (e.g., an opening/closing valve, a flow meter, or a flow rate control valve) interposed in the pipe.

The chemical liquid nozzle 41A and the rinse nozzle 42A have ejection ports that open obliquely downwards when the nozzles are in an upright orientation.

The configurations of the chemical liquid supply 41, the rinsing liquid supply 42, and the gas supply 43 are not limited to the illustrated ones. These supplies 41, 42, and 43 may take any configuration, as long as processing fluid supply conditions (e.g., liquid-incident angles θ and φ and gas ejection angles α and β) with respect to a peripheral portion of a wafer W, which will be described later, can be realized. It is preferable that the nozzle drive mechanisms 41B, 42B, and 43B have a biaxial or multiaxial nozzle orientation control function so that all of the liquid-incident angles θ and φ and the gas ejection angles α and β can be adjusted.

In FIG. 2, the heights of the chemical liquid supply 41, the rinsing liquid supply 42, and the gas supply 43 are different. However, this is merely to illustrate the supplies 41, 42, and 43 in the same drawing, and does not illustrate an actual implementation.

The liquid-receiving cup 50 is disposed to surround the substrate holder 31, and collects the processing liquid scattered (separated) from a rotating wafer W. A drain port 51 and an exhaust port 52 are formed at the bottom of the liquid-receiving cup 50. The processing liquid collected by the liquid-receiving cup 50 is discharged to the outside of the processing unit 16 from the drain port 51. The atmosphere in the liquid-receiving cup 50 is suctioned through the exhaust port 52 and discharged to the outside of the processing unit 16. With the suction of the atmosphere in the liquid-receiving cup 50, the atmosphere in the space above the liquid-receiving cup 50 (clean gas ejected from the FFU 21) is suctioned into the liquid-receiving cup 50 through the upper end opening of the liquid-receiving cup 50.

Next, liquid processing executed in the processing unit 16 when the gas nozzle 43A is not used will be briefly described with reference to FIGS. 3A to 6C. In FIGS. 3A to 6C, FIGS. 3A, 4A, 5A, and 6A are perspective views, FIGS. 3B, 4B, 5B, and 6B are side views, and FIGS. 3C, 4C, 5C, and 6C are plan views.

Figure 3A:
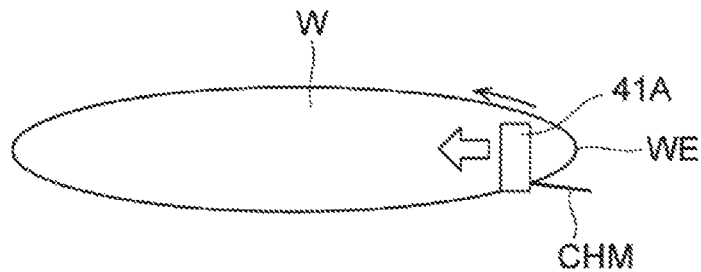
FIGS. 3A to 3C are views explaining liquid processing performed in the processing unit.
Figure 3B:
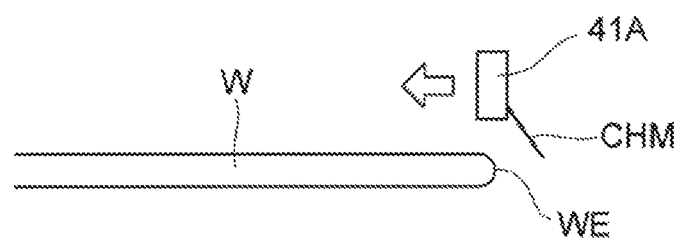
Figure 3C:
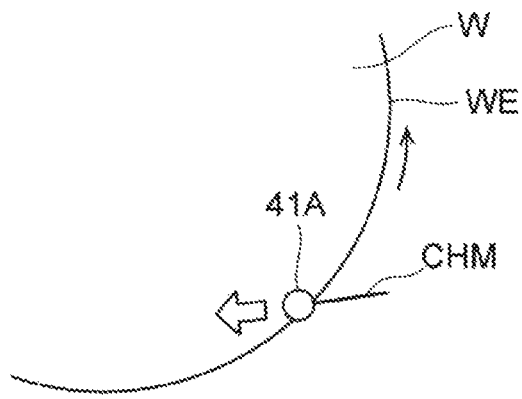

As illustrated in FIGS. 3A to 3C, ejection of a bevel-etching chemical liquid CHM starts from the chemical liquid nozzle 41A at the standby position (e.g., a position outside the peripheral edge WE of the wafer W in the radial direction). When the chemical liquid ejection flow rate becomes stable, the chemical liquid nozzle 41A is moved to the processing position such that the chemical liquid arrives at the peripheral portion of the wafer W, that is, a position radially inside the peripheral edge WE of the wafer W.

Figure 4A:
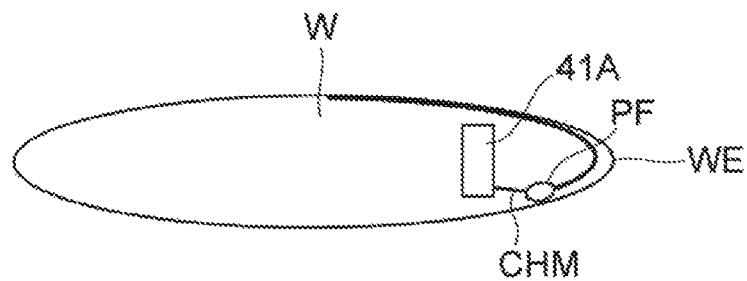
FIGS. 4A and 4C are views explaining liquid processing performed in the processing unit.
Figure 4B:
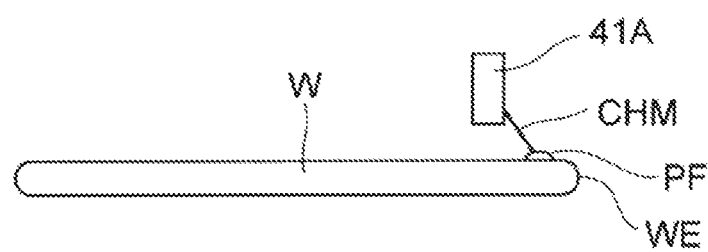
Figure 4C:
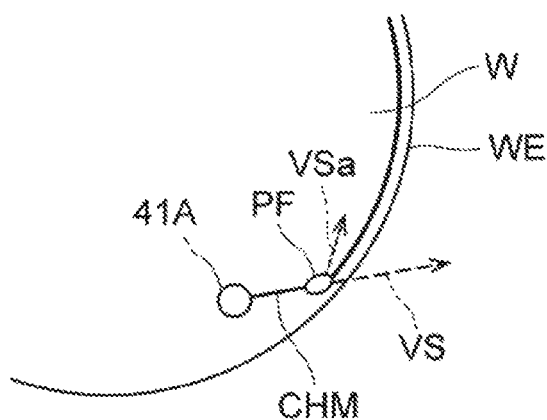

As illustrated in FIGS. 4A to 4C, the chemical liquid arriving at the peripheral portion of the rotating wafer W from the chemical liquid nozzle 41A removes a portion of the film on the surface of the wafer W, which is in contact with the chemical liquid, by etching. At this time, the chemical liquid is diffused to the peripheral edge WE of the wafer W and is then separated to the outside of the wafer W, or at the moment when the chemical liquid arrives at the wafer W, the chemical liquid bounces from the wafer W and is separated from the wafer W. Further details are provided with reference to the description on FIG. 7B below.

Figure 5A:
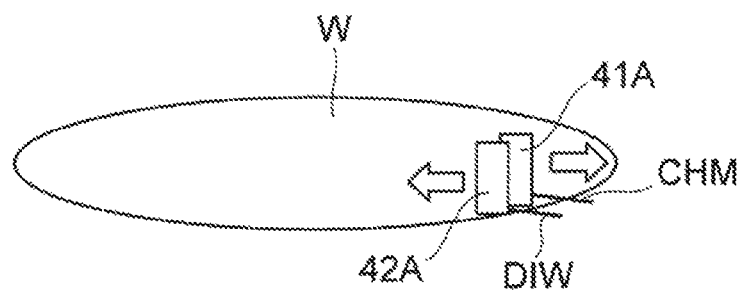
FIGS. 5A to 5C are views explaining liquid processing performed in the processing unit.
Figure 5B:
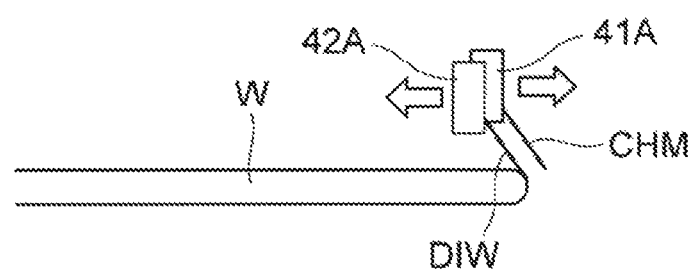
Figure 5C:
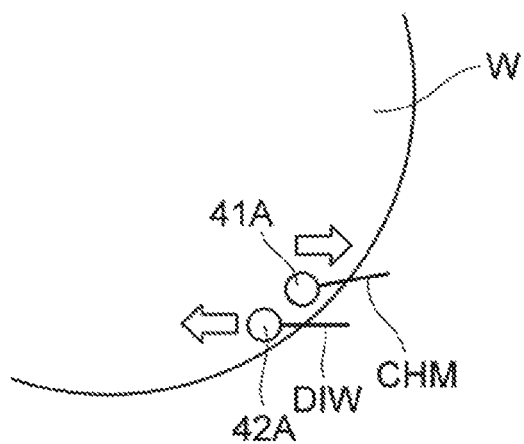

When a desired region of the peripheral portion of the wafer W is etched, the chemical liquid nozzle 41A is moved to the outside of the peripheral edge WE of the wafer W, and, in its place, the rinse nozzle 42A, which is ejecting the rinsing liquid (e.g., DIW) from the outside of the peripheral edge of the wafer, is moved toward an upper side of the wafer W, as illustrated in FIGS. 5A to 5C.

Figure 6A:
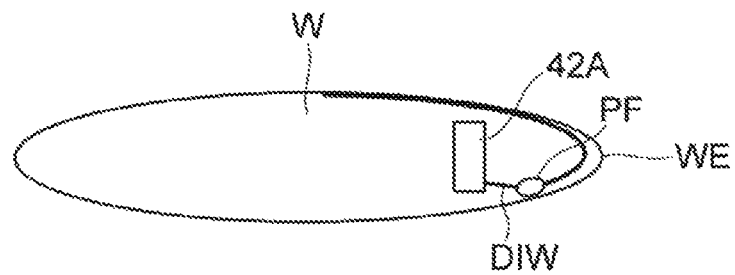
FIGS. 6A to 6C are views explaining liquid processing performed in the processing unit.
Figure 6B:
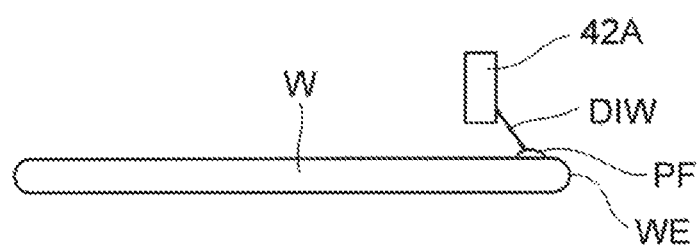
Figure 6C:
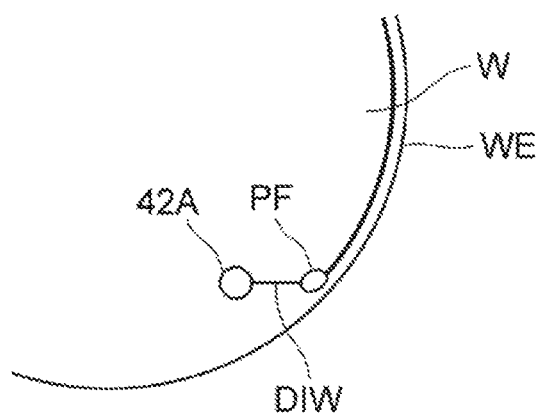

Then, as illustrated in FIGS. 6A to 6C, the rinsing liquid is ejected from the rinse nozzle 42A to the wafer W such that the liquid arrival point of the rinsing liquid is located slightly inside the liquid arrival point of the chemical liquid, and rinse processing is performed. At this time, the behavior of the rinsing liquid after arrival is almost the same as the behavior of the chemical liquid after arrival.

After the rinse processing is completed, the rinse nozzle 42A is retracted to the outside of the peripheral edge of the wafer W, and the wafer W is continuously rotated for performing centrifugal drying of the wafer W. At this time, the gas ejected from the gas nozzle 43A may be used to accelerate the drying.

In order to prevent the liquid from flowing from the front surface to the rear surface of the wafer W during the chemical liquid processing and the rinse processing, the rinsing liquid or a shield gas (e.g., nitrogen gas) may be supplied to the peripheral portion of the rear surface of the wafer W.

When the chemical liquid that has been scattered (separated) from the wafer W during the above-described chemical liquid processing is re-adhered to the wafer W, it causes particle generation. In the following, a method of preventing re-adhesion of the chemical liquid to a wafer W by using the gas nozzle 43A will be described. Since particles are generated when the rinsing liquid separated from the wafer W during the rinse processing is re-adhered to the wafer W, the method may be performed using the gas nozzle 43A during the rinse processing.

Prior to the description of the method of preventing re-adhesion of separated liquid, various parameters that define the flight trajectory of the chemical liquid CHM ejected from the chemical liquid nozzle 41A will be described with reference to FIG. 7A.

Figure 7A:
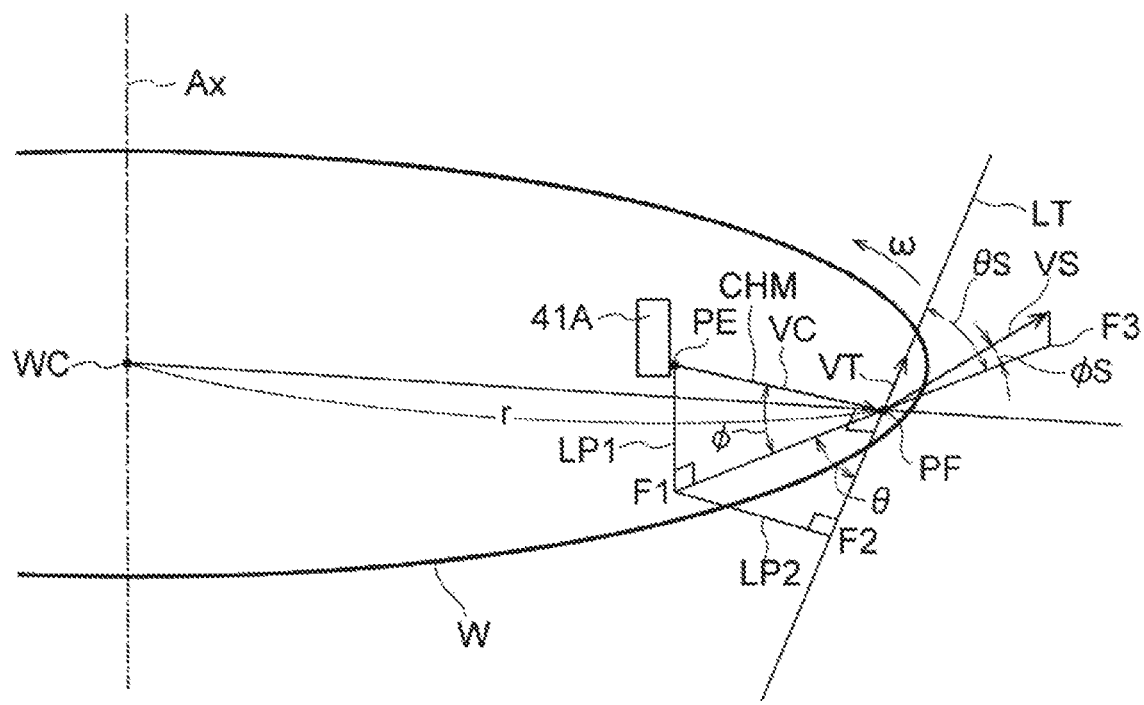
FIG. 7A is a perspective view explaining various parameters related to chemical liquid ejection from a chemical liquid nozzle.

In FIG. 7A, the definition of each symbol is as follows. The definitions of the following symbols are the same in the drawings other than FIG. 7A.

AX: a rotation axis of a wafer W

WC: an intersection of the surface of the wafer W and the rotation axis AX (the rotation center of the wafer W on the surface of the wafer W)

WE: the outermost edge of the wafer W (also referred to as "APEX")

PE: a point of ejection of a chemical liquid (the ejection port of the chemical liquid nozzle 41A)

PF: a liquid arrival point on the surface of the wafer W

ω): the rotation direction of the wafer W r: a distance from the rotation center WC to the liquid arrival point PF LT: a tangential line at the liquid arrival point PF on the circumference of a circle (which is on the same plane as the surface of the wafer W) having a radius r centered on the rotation center WC VC: a vector indicating a flight trajectory of the chemical liquid from the ejection point PE to the liquid arrival point PF VT: a tangential component of the vector VC indicating the movement of the chemical liquid at the liquid arrival point PF (In addition, the direction of the vector VT is preferably the same as the rotation direction ω of the wafer W. If the direction of the vector VT is opposite the rotation direction ω, it may be difficult to control the scattering (splashing) of the chemical liquid at the liquid arrival point PF.)

F1: a foot of a perpendicular line LP1 drawn from the ejection point PE to the surface of the wafer W F2: a foot of a perpendicular line LP2 drawn from the foot F1 to the tangent line LT θ: an angle formed between the line segment F1PF and the line segment F2PF (also referred to as "first liquid-incident angle θ")

φ: an angle formed between the line segment PEPF and the line segment F1PF (also referred to as a "second liquid-incident angle φ")

VS: a vector indicating the main flow direction of the chemical liquid CHM that is scattered (immediately leaves) in the outward direction of the wafer W immediately after the liquid arrives at the liquid arrival point PF F3: a foot of a perpendicular line drawn from a point on the vector VS onto a plane including the surface of the wafer W θS: an angle formed between the tangential line LT and the line segment PFF3 (also referred to as a "first liquid separation angle θS")

φS: an angle formed between the line segment PFF3 and the vector VS (also referred to as a "second liquid separation angle φS")

Figure 7B:
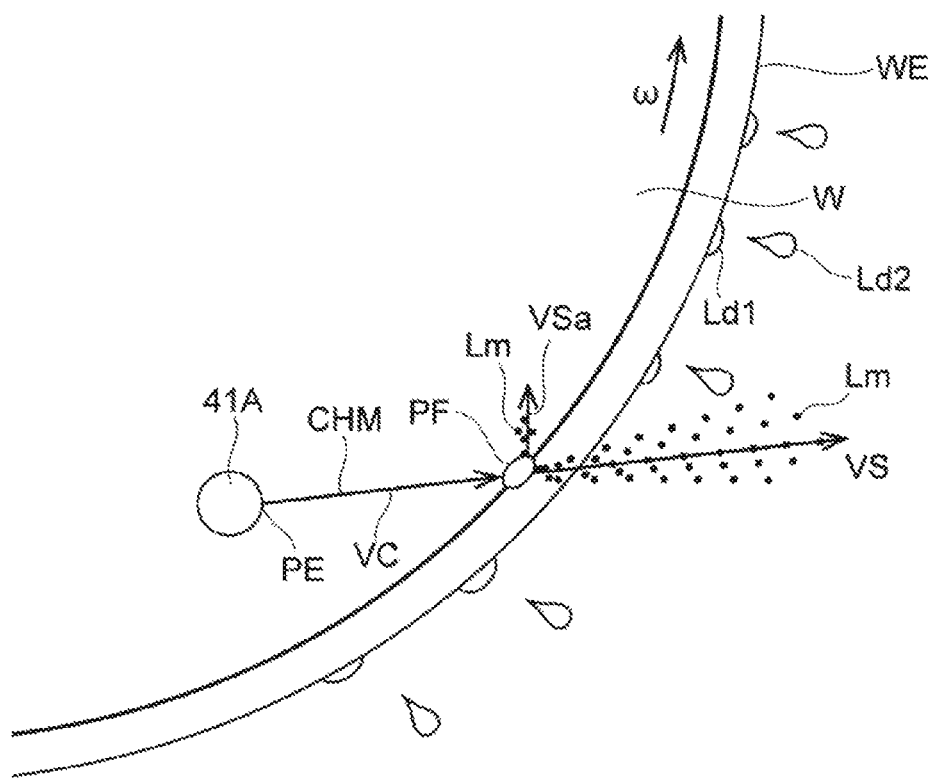
FIG. 7B is a plan view explaining behavior of a chemical liquid ejected from a chemical liquid nozzle after the liquid arrives at a substrate.

FIG. 7B is a view explaining separation of the chemical liquid from the wafer W. The chemical liquid, which arrives at the peripheral portion of the rotating wafer W after being ejected from the chemical liquid nozzle 41A, is diffused toward the peripheral edge WE of the wafer W by centrifugal force, and is separated from the peripheral edge W and the vicinity thereof, thereby being scattered in the form of droplets. This phenomenon will be referred to as "separation-after-diffusion". In FIG. 7B, droplets immediately before separation caused due to separation-after-diffusion are indicated by reference numeral Ld1, and droplets immediately after separation caused due to separation-after-diffusion are indicated by reference numeral Ld2. The size of the droplets generated due to separation-after-diffusion is relatively large.

Some of the chemical liquid arriving at the liquid arrival point PF on the peripheral portion of the wafer W immediately bounces from the surface of the wafer W, is separated from the wafer W immediately after arrival without being diffused toward the peripheral edge of the wafer W, and is scattered in the form of droplets. This phenomenon is referred to as "immediate separation". The immediately separated chemical liquid is turned into minute droplets (Lm in FIG. 7B) having a relatively small size in the direction indicated by the arrow VS (outside the wafer W) and in the direction indicated by the arrow VSa (inside the wafer W), and the minute liquid droplets are scattered. The minute liquid droplets are scattered in regions with certain widths whose centers are the arrow VS and the arrow VSa, respectively. The arrow VS and the arrow VSa indicate the directions of main streams of scattered droplets.

Four techniques for preventing liquid re-adhesion using the gas nozzle 43A as described below relate to a method of preventing re-adhesion of droplets that are immediately separated.

<First Method>

First, a first method will be described with reference to FIGS. 8A and 8B.

In the specification and the drawings, symbols are used for descriptions as follows:
the liquid arrival point PF when gas is not being ejected from the gas nozzle 43A (while gas is not being ejected) will be indicated as "PFi"
the liquid arrival point PF when gas is being ejected from the gas nozzle 43A (during gas ejection) will be indicated as "PFm"
the vector VC indicating a flight trajectory of the chemical liquid while gas is not being ejected will be indicated as "VCi"
the vector VC indicating a flight trajectory of the chemical liquid during gas ejection will be indicated as "VCm"
the main stream vector VS of immediately separated chemical liquid directed to the outside of the wafer while gas is not being ejected will be indicated as "VSi"
the main stream vector VS of immediately separated chemical liquid directed to the outside of the wafer during gas ejection will be indicated as "VSm"
the value of the first liquid-incident angle θ while gas is not being ejected will be indicated as "θi"
the value of the first liquid-incident angle θ during gas ejection will be indicated as "θm"
the value of the first liquid separation angle θS while gas is not being ejected will be referred to as "θSi"
the value of the first liquid separation angle θS during gas ejection will be referred to as "θSm"
the value of the second liquid-incident angle φ while gas is not being ejected will be indicated as "φi"
the value of the second liquid-incident angle φ during gas ejection will be referred to as "φm"
the value of the second liquid separation angle φS while gas is not being ejected will be referred to as "φSi"
the value of the second liquid separation angle φS during gas ejection will be referred to as "φSm".

The gas nozzle 43A can be arranged so as to satisfy the following conditions. The gas ejected from the gas nozzle 43A changes the direction of the chemical liquid (CHM) which is in the process of flying from the ejection port (ejection point PE) of the chemical liquid nozzle 41A toward the liquid arrival point PFi on the wafer W. That is, the flight trajectory VC of the chemical liquid when the gas is not being ejected from the gas nozzle 43A (the straight line connecting the ejection point PE of the chemical liquid and the liquid arrival point PFi) is twisted by the gas ejected from the gas nozzle 43A (VCi→VCm). As a result, the value of the first liquid-incident angle θ is increased from θi to θm (θi<θm) (liquid arrival condition 1). Further, the value of the second liquid-incident angle φ is decreased from φi to φm (φi>φm) (liquid arrival condition 2). The direction of the main stream of the gas ejected from the gas nozzle 43A is indicated by the arrow G.

In an embodiment, the gas nozzle 43A may be arranged such that the axis line of the ejection port of the gas nozzle 43A intersects the flight trajectory VC of the chemical liquid directed from the chemical liquid ejection point PE to the liquid arrival point PF. In addition, the radial position of the ejection port of the gas nozzle 43A (corresponding to the distance measured in the radial direction of the wafer W from the rotation center WC of the wafer W in a plan view (the same applies hereinafter)) may be arranged in the radially inward position of the radial position of the chemical liquid ejection point PE. Further, the ejection port of the gas nozzle 43A may be arranged at a position lower than the height of the ejection port of the chemical liquid nozzle 41A.

Due to the inertial force acting on the chemical liquid, when the first liquid-incident angle θ is increased, the first liquid separation angle θS is also increased (θSi→θSm). Preferably, the liquid separation direction is close to the radial direction of the wafer W (that is, |90 deg−θS| (the absolute value of 90 deg−θS) is close to zero deg). In this case, the liquid droplets immediately separated from the peripheral edge of the wafer W leave the region near the peripheral edge WE of the wafer W in a short time, and the possibility that the immediately separated liquid droplets will be re-adhered to the wafer W is reduced. As |90 deg−θS| becomes larger (especially, when 90 deg−θS is positive), the time for the immediately separated droplets to drift near the peripheral edge WE of the wafer W becomes longer. Thus, there is a high possibility that the immediately separated droplets will be re-adhered to the wafer W.

That is, as described above, by changing the direction of the chemical liquid in flight (after ejection and before arrival) by the gas to make the first liquid separation angle θS close to 90 degrees (θSi→θSm), it is possible to reduce the possibility that the liquid droplets of the immediately separated chemical liquid will be re-adhered to the wafer W. In so doing, it is actually possible to suppress the re-adhesion of the droplets of the chemical liquid that is immediately separated.

Figure 12:
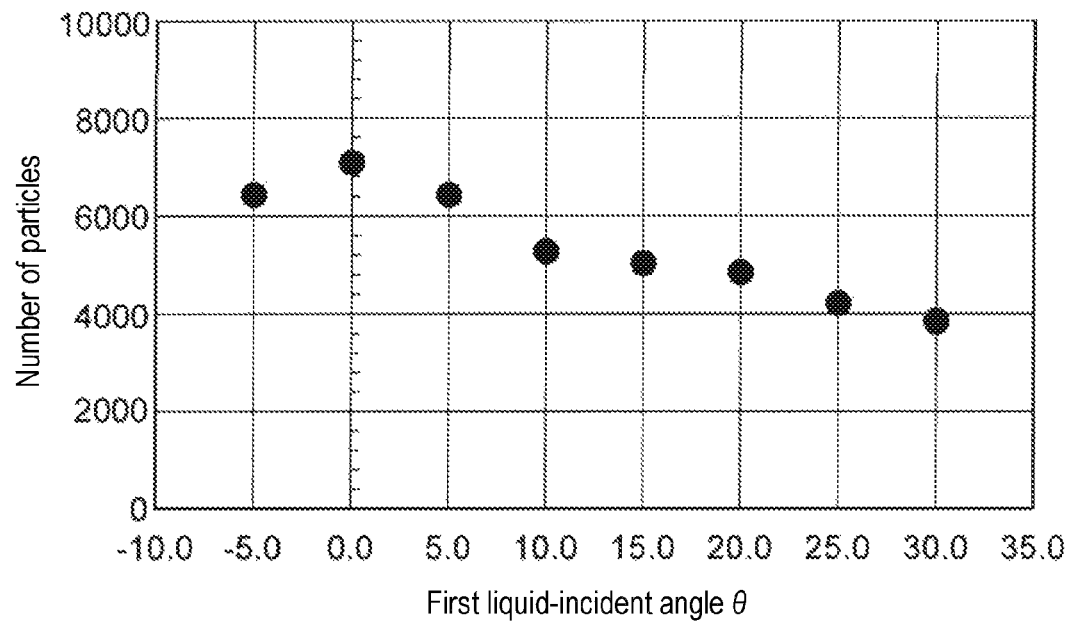
FIG. 12 is a graph explaining test results.

FIG. 12 is a graph showing the results of a test for examining a relationship between the first liquid-incident angle θ and the number of particles. From this graph, it can be seen that the number of particles decreases as the first liquid-incident angle θ increases. As described above, as the first liquid-incident angle θ increases, the first liquid separation angle θS also increases. Thus, the number of particles decreases as the first liquid separation angle θS increases.

In addition, the larger the second liquid-incident angle φ, the greater the impact at the time of liquid arrival, and the greater the amount of liquid droplets bouncing off at the time of liquid arrival (immediately separated liquid droplets). That is, by reducing the second liquid-incident angle φ (φi→φm), it is possible to reduce the amount of immediately separated liquid droplets. Instead, the amount of droplets separated after diffusion increases. Further, the droplets separated after diffusion are separated from the peripheral edge of the wafer W in the horizontal direction or slightly downward from the horizontal direction, and have a relatively large size. For this reason, since the droplets separated after diffusion do not drift above the surface of the wafer W for a long time, it is difficult for those droplets to cause generation of particles due to re-adhesion.

Figure 8A:
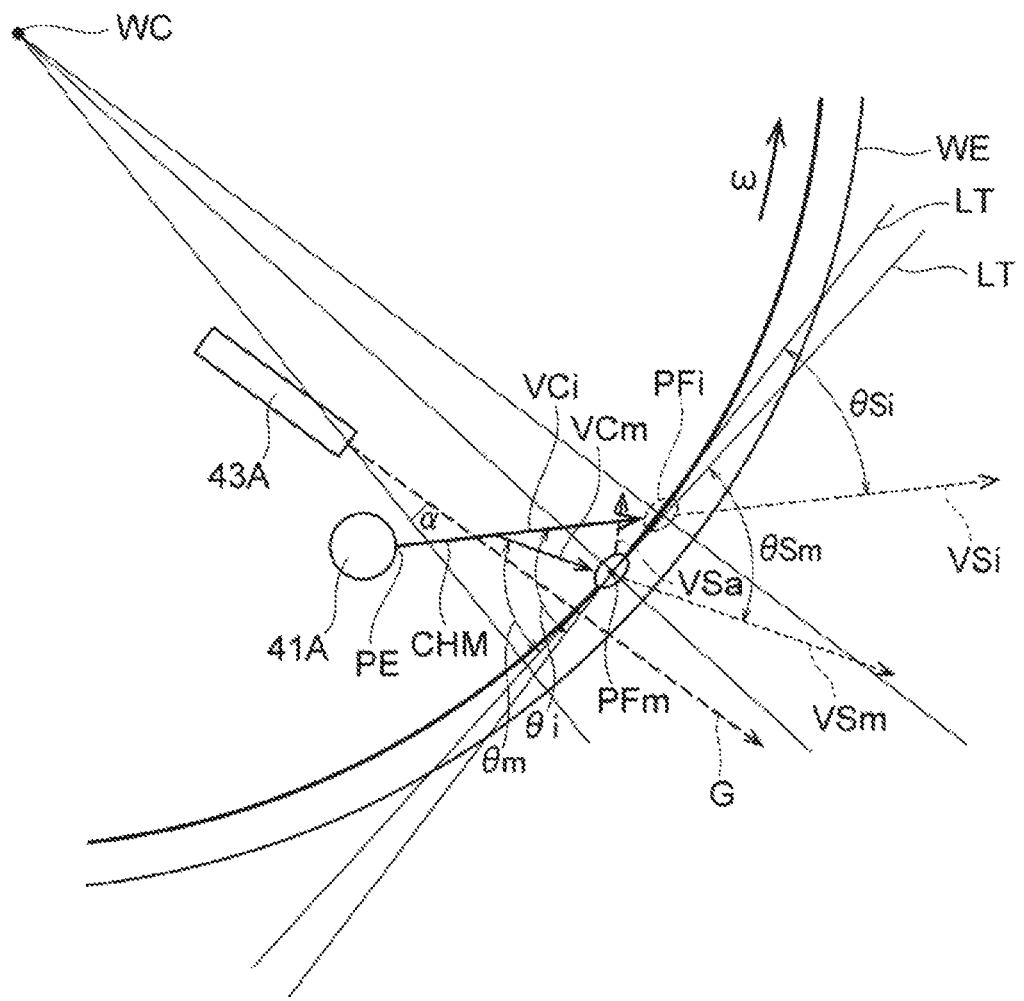
FIG. 8A is a plan view explaining a first method for preventing re-adhesion of a separated chemical liquid.

As described above with reference to FIG. 7B, some of the immediately separated chemical liquid is scattered as minute droplets, although the amount thereof is small, in the region around the arrow VSa in FIG. 8A (the region radially inside the circle including the liquid arrival point PF). It is also possible to reduce the amount of such droplets by reducing the second liquid-incident angle φ. Further, by increasing the first liquid-incident angle θ, the direction of the arrow VSa approaches the tangential direction LT (see FIG. 7A for the definition thereof) at the liquid arrival point PF. For this reason, it is less likely that the droplets scattered in the direction of the arrow VSa will be re-adhered to the surface of the wafer W.

Figure 8B:
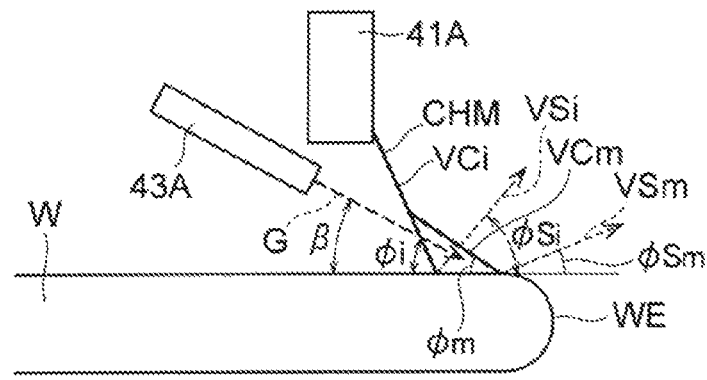
FIG. 8B is a side view explaining the first method for preventing re-adhesion of the separated chemical liquid.

As described above, it is also possible to reduce the amount of the chemical liquid that is immediately separated from the wafer W by reducing the second liquid-incident angle φ by the action of the gas changing the direction of the chemical liquid in flight, as illustrated in FIG. 8B. For this reason, it is possible to further reduce the possibility that the droplets separated from the wafer will be re-adhered to the wafer W.

In addition, by reducing the second liquid-incident angle φ, the second liquid separation angle φ S is also reduced (φSi→φSm in FIG. 8B). That is, the direction of immediate separation approaches the horizontal direction. This reduces the amount of droplets that drift above the plane containing the surface of the wafer W and are likely to be re-adhered to the wafer W. For this reason, it is possible to further reduce the possibility that the droplets separated from the wafer will be re-adhered to the wafer W.

The gas ejected from the gas nozzle 43A may satisfy only one of the arrival conditions 1 and 2 described above, but it is preferable to satisfy both thereof.

In addition, in the region around the arrow G illustrated in FIGS. 8A and 8B (the arrow G indicates the main stream of gas), a gas flow that flows in a direction substantially parallel to the arrow G is generated. The flow velocity of the gas decreases as the distance from the arrow G increases, which may affect the path of the droplets that are immediately separated at the liquid arrival point PF. That is, the gas ejected from the gas nozzle 43A not only changes the direction of the chemical liquid CHM in flight, but also functions to blow the droplets immediately separated from the wafer W to the outside of the wafer W in the radial direction. For this reason, since the liquid droplets separated from the wafer W immediately move away from the wafer W, it is possible to further reduce the possibility that the immediately separated liquid droplets will be re-adhered to the wafer W.

As the direction of the main stream G of the gas and the direction VCm of the flight trajectory of the chemical liquid, the direction of which is changed by the gas (the flight trajectory after changing direction), approach each other, the effect of blowing off the separated chemical liquid by the gas described above is increased. For example, by increasing the flow velocity of the gas ejected from the gas nozzle 43A or decreasing the flow velocity of the chemical liquid ejected from the chemical liquid nozzle 41A, it is possible to bring the direction of the main stream G of the gas and the direction VCm of the flight trajectory of the chemical liquid, the direction of which is changed by the gas, closer to each other.

Further, the droplets indicated by the arrow VSa in FIG. 8A described above are also blown off to the outside of the wafer W in the radial direction by the gas ejected from the gas nozzle 43A. For this reason, it is possible to further reduce the possibility that the droplets separated from the wafer will be re-adhered to the wafer W. This effect is greater as the direction of the main stream G of the gas and the direction VCm of the flight trajectory of the chemical liquid, which is changed by the gas (the flight trajectory after changing direction), are closer to each other.

In the processing unit 16 having the configuration illustrated in FIG. 2, a clean gas ejected downward from the FFU 21 toward the wafer W is drawn into the liquid-receiving cup 50 as described above. At this time, the clean gas flows to the outside in the radial direction along the surface of the peripheral portion of the wafer W, is then separated from a region radially outside the wafer, and then flows downward (see the arrow F in FIG. 2). The flow of the clean gas also prevents the droplets separated from the wafer W from being re-adhered to the wafer. Therefore, it is desirable to eject the gas from the gas nozzle 43A so as not to oppose the flow of the clean gas.

That is, an angle α (also referred to as a "first gas ejection angle α") formed between the gas ejection direction (the direction of arrow G in FIG. 8A) and the radial direction of the wafer W passing through the ejection port of the gas nozzle 43A (see FIG. 8A) is preferably 0±90 degrees. Similarly, from the viewpoint of not opposing the flow of clean gas, an angle β formed between the gas ejection direction (the direction of the arrow G in FIG. 8B) and the surface of the wafer W (also referred to as a "second gas ejection angle β") is preferably in the range of about 0 to 45 degrees.

In the above-mentioned first method, the gas ejected from the gas nozzle 43A has two effects, that is, one of controlling the liquid separation angle so as to make it difficult for the liquid to be re-adhered to the wafer again, and one of suppressing re-adhesion of the separated liquid droplets to the wafer by blowing off the separated liquid droplets.

Appropriate values for the first gas ejection angle α, the second gas ejection angle β, and the gas ejection velocity (specifically, for example, the ejection velocity at the ejection port of the gas nozzle 43A) for achieving the above-described various effects may be determined through tests considering, for example, the state of the chemical liquid (e.g., viscosity and surface tension) and the state of the wafer W (e.g., surface state such as hydrophobicity). The first gas ejection angle α and the second gas ejection angle β can be adjusted using the orientation control function of the gas nozzle 43A. The orientation control function is included in the gas nozzle drive mechanism 43B. In addition, the gas ejection velocity can be adjusted using a flow control device included in the gas supply mechanism 43C.

In addition to adjusting the first gas ejection angle α, the second gas ejection angle β, and the gas ejection velocity, by adjusting the first liquid-incident angle θ, the second liquid-incident angle φ, and the chemical liquid ejection velocity, the re-adhesion of separated droplets to the wafer may be more reliably prevented or suppressed.

Processing parameters including the above-mentioned parameters α, β, θ, and φ (e.g., the position of PE, the position of PF, the wafer rotation speed, the chemical liquid ejection flow velocity, the chemical liquid ejection flow rate, the gas ejection flow velocity, and the gas ejection flow rate) are stored in the storage part of the control device 4 as processing parameters defined by a processing recipe. The control device 4 controls devices/apparatuses such as the processing fluid supply 40 and the rotary driver 32 based on the process recipe so as to execute the first method described above. In this respect, the same applies to the second, third, and fourth methods described below.

<Second Method>

Next, the second method will be described with reference to FIGS. 9A and 9B.

In the second method, the gas nozzle 43A is arranged so as to satisfy the following conditions. The gas ejected from the gas nozzle 43A is sprayed toward the liquid arrival point PF (PFi). As a result, the chemical liquid that is about to be immediately separated from the wafer W at the liquid arrival point PF or the chemical liquid directly after immediate separation is blown off so as to immediately move away from the wafer W.

Figure 9A:
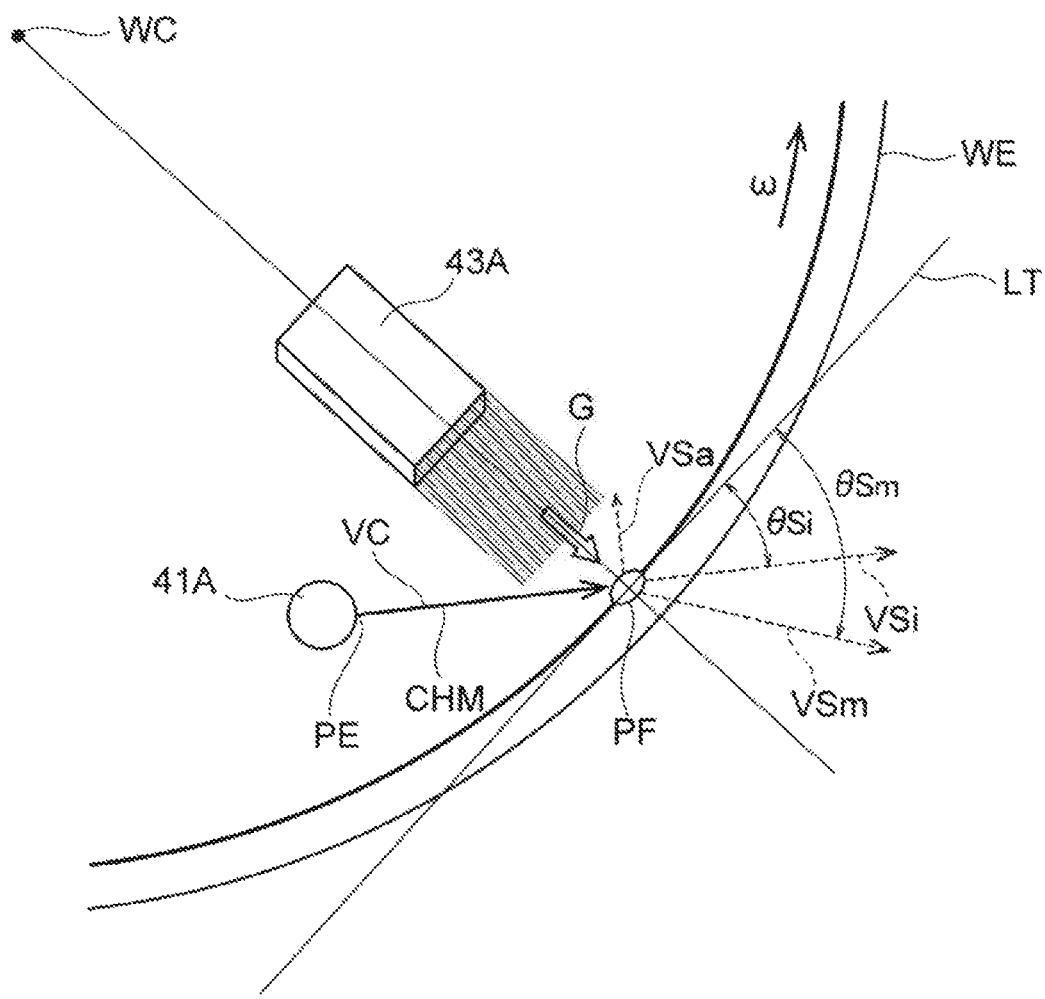
FIG. 9A is a plan view explaining a second method for preventing re-adhesion of a separated chemical liquid.
Figure 9B:
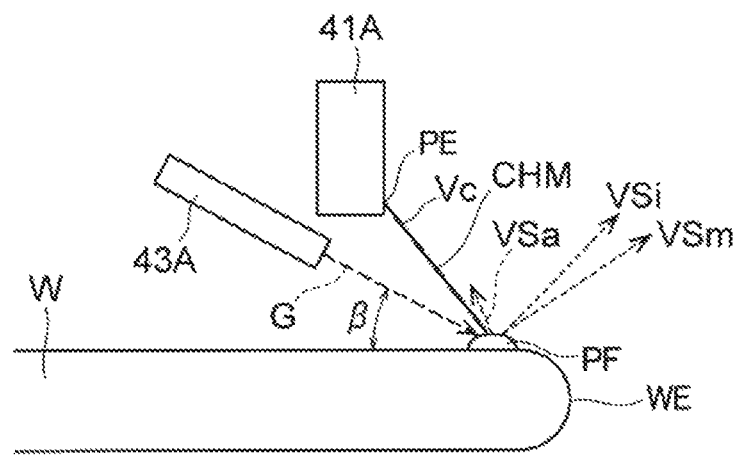
FIG. 9B is a side view explaining the second method for preventing re-adhesion of the separated chemical liquid.

At this time, as illustrated in FIG. 9A, the gas is ejected from the gas nozzle 43A such that the first liquid separation angle θS (θSm) is as close as possible to 90 degrees (θSi→θSm) (separation condition 1), and such that, as illustrated in FIG. 9B, the second liquid separation angle φS (φSm) is as small as possible (φi→φm) (separation condition 2).

As described above in connection with the first method, the liquid droplets immediately separated from the wafer W are spaced apart from a region in the vicinity of the peripheral edge WE of the wafer W in a short time by bringing the direction of liquid separation closer to the radial direction of the wafer W (i.e., by bringing |90 deg−θS| closer to zero deg). Further, by decreasing the second liquid separation angle φSm, the liquid droplets immediately separated from the wafer W are spaced apart from the region in the vicinity of the peripheral edge WE of the wafer W in a short time, and the floating height of the liquid droplets becomes low. For this reason, it is possible to reduce the possibility that the immediately separated droplets will be re-adhered to the wafer W.

By any of the separation conditions 1 and 2 described above, it is possible to reduce the possibility that the immediately separated liquid droplets will be re-adhered to the wafer W. It is sufficient to satisfy only one of the separation conditions 1 and 2 described above, but it is preferable to satisfy both of the conditions.

In addition, according to the second method, it is also possible to prevent or suppress the generation of droplets that tend to be scattered as droplets in a region radially inside the circle including the liquid arrival point PF, as indicated by the arrow VSa. Even if a droplet that advances in the direction indicated by the arrow VSa is generated, the droplet is blown off by the gas ejected from the gas nozzle 43A to the outside of the wafer W in the radial direction.

Further, the chemical liquid is diffused in the direction along the surface of the wafer W (in particular, the rotation direction of the wafer W) at the moment when the chemical liquid arrives at the liquid arrival point PF Immediate separation occurs in the region in which the chemical liquid is diffused. A maximum width of the region in which the chemical liquid is diffused is larger than the diameter of a liquid column of the chemical liquid ejected from the ejection port of the chemical liquid nozzle 41A, and is, for example, about 5 mm. Therefore, it is preferable for the gas to be sprayed over a wide range such that the region in which the chemical liquid is diffused is sufficiently covered. In order to realize this, it is preferable for the ejection port of the gas nozzle 43A to have a laterally elongated shape, such as a rectangular shape or an oval shape. The lateral length of the ejection port of the gas nozzle 43A may be set to, for example, about 10 mm. The wind speed of the gas may be set to about 5 to 30 msec.

Similar to the first method, in the second method as well, appropriate values of the first gas ejection angle α, the second gas ejection angle β, and the gas ejection velocity can be obtained through tests. In addition to adjusting the first gas ejection angle α, the second gas ejection angle β, and the gas ejection velocity, by adjusting the first liquid-incident angle θ, the second liquid-incident angle φ, and the chemical liquid ejection velocity, re-adhesion of separated droplets to the wafer may be more reliably prevented or suppressed.

<Third Method>

Figure 10A:
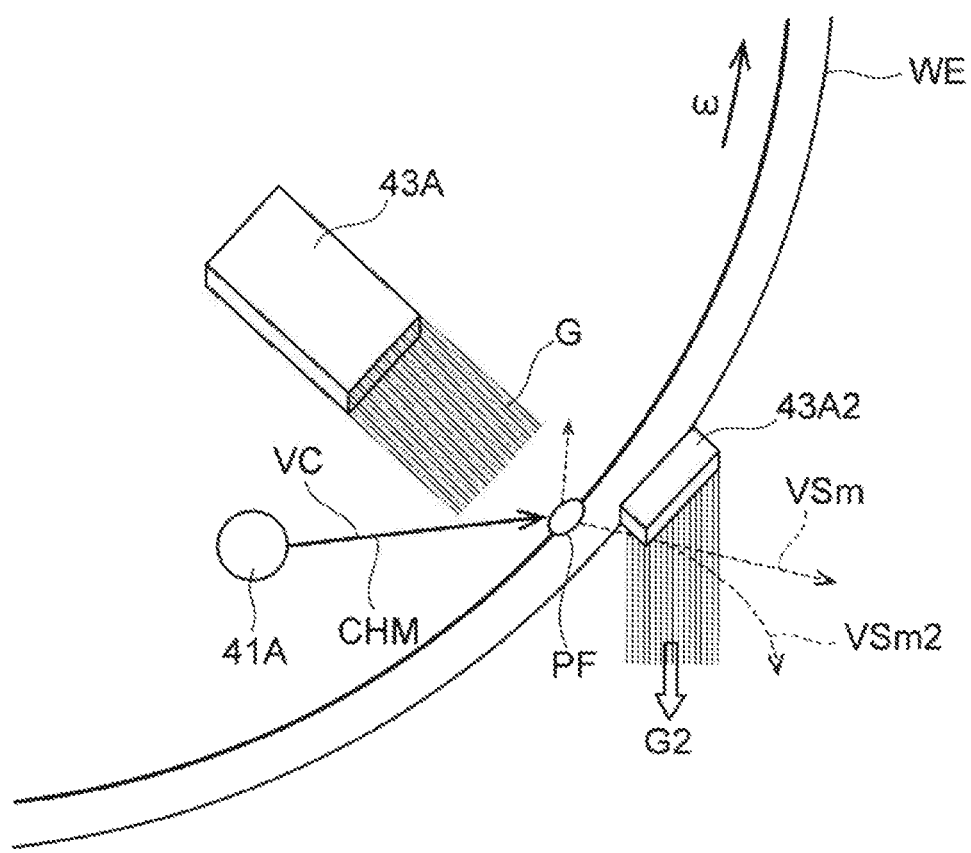
FIG. 10A is a plan view explaining a third method for preventing re-adhesion of a separated chemical liquid.
Figure 10B:
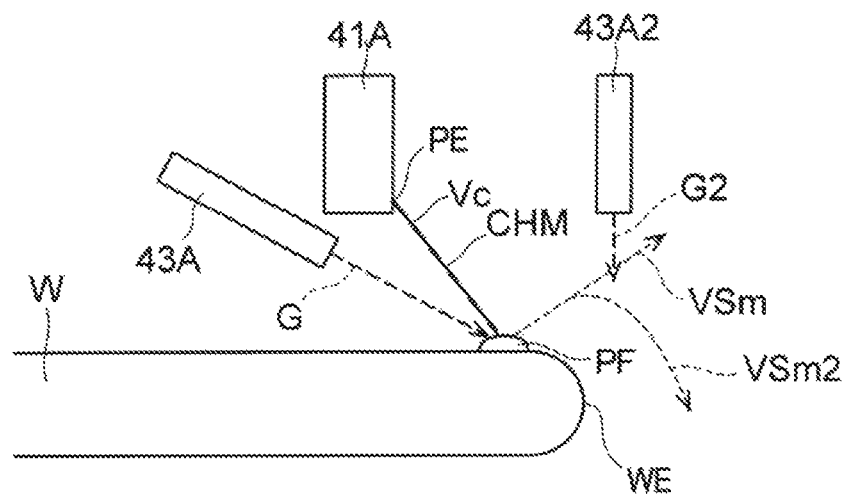
FIG. 10B is a side view explaining the third method for preventing re-adhesion of the separated chemical liquid.

Next, the third method will be described with reference to FIGS. 10A and 10B. In the third method, in addition to the second method, by an additional nozzle (additional gas nozzle) 43A2 arranged outside the peripheral edge of the wafer W, the droplets immediately separated from the wafer W are blown off downward (see the arrow VSm2) and drop onto a region below the surface of the wafer W. By moving the floating droplets to a height lower than the surface of the wafer W, it is possible to significantly reduce the possibility that the immediately separated droplets will become re-adhered to the surface of the wafer W.

The additional nozzle 43A2 may be arranged such that a gas G2 ejected from the additional nozzle 43A2 is able to act on a region (around the arrow VSm) in which the droplets of the chemical liquid immediately separated from the wafer W are distributed. The gas may be ejected from an upright additional nozzle 43A2 to a location immediately thereunder, but the additional nozzle 43A2 may be slightly inclined such that the gas ejected from the additional nozzle 43A2 has a radially outward velocity component.

<Fourth Method>

Next, the fourth method will be described. The fourth method differs from the second method in that the gas ejected from the gas nozzle 43A is a heated gas. In the fourth method as well, the effect of moving the immediately separated chemical liquid away from the wafer W is the same as in the second method.

Figure 11:
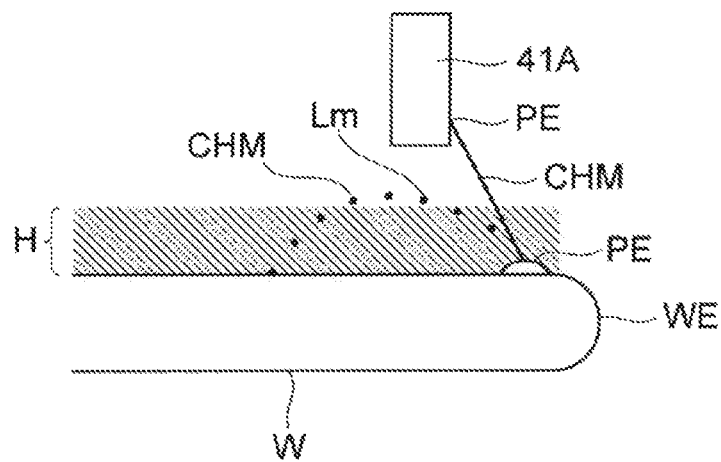
FIG. 11 is a side view explaining a fourth method for preventing re-adhesion of a separated chemical liquid.

In the fourth method, the temperature in the vicinity of the wafer W is increased by a high-temperature gas (e.g., 70 to 150 degrees C., in a specific example, about 90 degrees C.) ejected from the gas nozzle 43A (not illustrated in FIG. 11). In FIG. 11, an area having a high temperature is indicated by reference numeral H. Among the liquid droplets separated from the wafer W, the minute liquid droplets Lm (the liquid droplets indicated by the arrow VSa in, for example, FIGS. 8A and 9A) scattered in the region radially inside the circle including the liquid arrival point are vaporized and evaporated while passing through the high temperature area H. For this reason, it is possible to prevent the minute droplets Lm from dropping onto the surface of the wafer W to turn into particles after floating in the space above the wafer W.

The fourth method is particularly effective for a chemical liquid containing low boiling point components, such as DHF containing hydrofluoric acid and SC1 containing ammonia.

Together with the fourth method, by heating the wafer W, the temperature of the heated gas layer existing in the vicinity of the surface of the wafer W can be raised, and the minute droplets of the chemical liquid can be more reliably eliminated. As means for heating the wafer W, for example, as shown by the broken lines in FIG. 2, a heater 44 arranged close to the peripheral portion of the rear surface (lower surface) of the wafer W may be used. Alternatively, for example, a nozzle 45 for supplying a heated fluid, such as nitrogen gas or hot DIW (heated pure water), to the peripheral portion of the rear surface of the wafer W may be arranged and used as a means for heating the wafer W. Such a fluid may be used so as to prevent a processing liquid (e.g., a chemical liquid) supplied to the front surface of the wafer from flowing around to the rear surface of the wafer, or to achieve a sufficient reaction rate between the chemical liquid and the wafer by heating the wafer W.

Figure 13:
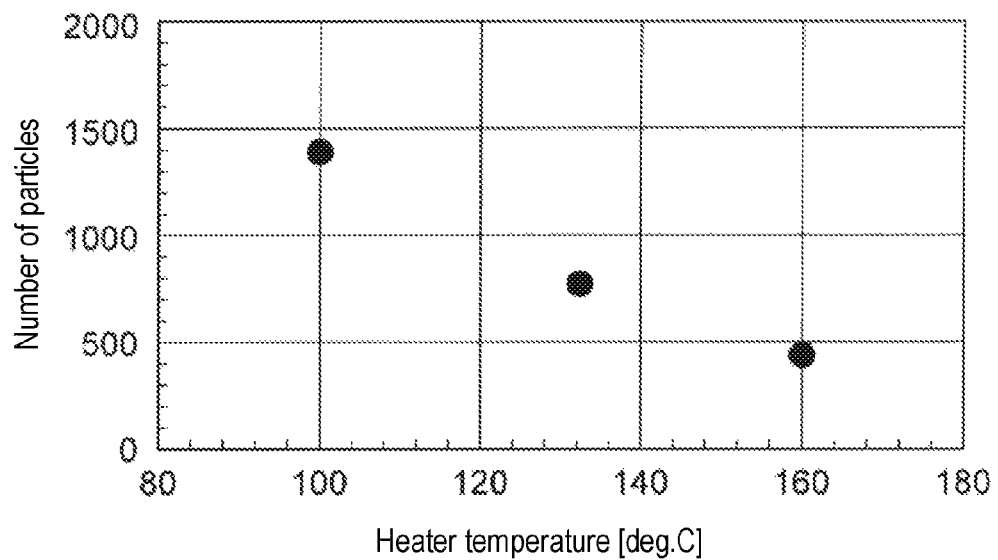
FIG. 13 is a graph explaining test results.

FIG. 13 is a graph showing results of tests for examining a relationship between the heater temperature and the number of particles when the heater 44 is provided as described above. From this graph, it can be seen that the number of particles can be reduced based on the above-described principle by increasing the temperature near the surface of the wafer W.

The substrate to be processed is not limited to a semiconductor wafer, but may be any of various substrates used in the semiconductor device manufacturing field, such as a glass substrate or a ceramic substrate.

According to the present disclosure, it is possible to prevent or suppress a processing liquid, which has been separated from a substrate, from re-adhering to the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a substrate holder configured to hold a substrate;
a rotary driver configured to rotate the substrate holder around a rotation axis;
a processing liquid nozzle configured to eject a processing liquid toward a peripheral portion of the substrate; and
a gas nozzle configured to eject a gas toward the processing liquid from a time at which the processing liquid is ejected from an ejection port of the processing liquid nozzle until a time at which the processing liquid arrives at a liquid arrival point on the substrate,
wherein a flight trajectory of the processing liquid is changed by the gas ejected through the gas nozzle, and
wherein droplets separated from the substrate are blown off to an outside of the substrate in a radial direction by the gas ejected from the gas nozzle.

2. The substrate processing apparatus of claim 1, wherein an ejection port of the gas nozzle is located closer to a center of the substrate than the ejection port of the processing liquid nozzle when viewed in a direction of the rotation axis.

3. The substrate processing apparatus of claim 2, wherein the gas is a heated gas.

4. The substrate processing apparatus of claim 2, further comprising a gas nozzle direction adjustment mechanism configured to change an orientation of the gas nozzle.

5. The substrate processing apparatus of claim 2, wherein the ejection port of the gas nozzle is open toward the flight trajectory of the processing liquid from the ejection port of the processing liquid nozzle to the liquid arrival point of the processing liquid on the substrate.

6. The substrate processing apparatus of claim 5, wherein, when a circle, which is centered on a foot of a perpendicular line drawn from the liquid arrival point to the rotation axis and has a radius corresponding to a line segment connecting the foot and the liquid arrival point, is defined to be located on a plane orthogonal to the rotation axis, and
when an angle formed between a straight line, which connects a foot of a perpendicular line drawn from the ejection port of the processing liquid nozzle to a surface of the substrate and the liquid arrival point, and a tangential line of the circle at the liquid arrival point is an angle θ,
the processing liquid nozzle is installed such that the angle θ becomes a first angle smaller than 90 degrees when the gas is not ejected from the gas nozzle, and
the gas nozzle is installed to change a direction of the processing liquid ejected from the processing liquid nozzle such that the angle θ becomes a second angle closer to 90 degrees than the first angle when the gas is ejected from the gas nozzle.

7. The substrate processing apparatus of claim 6, wherein, when an angle formed between a vector indicating an orientation of a main stream of the processing liquid separated to an outside of the substrate from the liquid arrival point when viewed in a direction of the rotation axis of the substrate and a tangential line of the circle at the liquid arrival point is an angle θS,
the processing liquid nozzle is installed such that the angle θS becomes a first angle smaller than 90 degrees when the gas is not ejected from the gas nozzle, and
the gas nozzle is installed to change the direction of the processing liquid separated from the liquid arrival point such that the angle θS becomes a second angle closer to 90 degrees than the first angle when the gas is ejected from the gas nozzle.

8. The substrate processing apparatus of claim 5, wherein, when an angle formed between a straight line, which connects a foot of a perpendicular line drawn from the ejection port of the processing liquid nozzle to a surface of the substrate and the liquid arrival point, and a straight line connecting the ejection port of the processing liquid nozzle to the liquid arrival point is an angle φ, the processing liquid nozzle is installed such that the angle φ becomes a first angle smaller than 90 degrees when the gas is not ejected from the gas nozzle, and the gas nozzle is installed to change the direction of the processing liquid ejected from the processing liquid nozzle such that the angle φ becomes a second angle closer to 0 degrees than the first angle when the gas is ejected from the gas nozzle.

9. The substrate processing apparatus of claim 2, wherein the ejection port of the gas nozzle is open toward the liquid arrival point of the processing liquid ejected from the processing liquid nozzle.

10. The substrate processing apparatus of claim 9, wherein the ejection port of the gas nozzle has a laterally elongated shape.

11. The substrate processing apparatus of claim 1, wherein the gas is a heated gas.

12. The substrate processing apparatus of claim 1, further comprising a gas nozzle direction adjustment mechanism configured to change an orientation of the gas nozzle.

13. The substrate processing apparatus of claim 12, wherein the gas nozzle direction adjustment mechanism is configured to be capable of adjusting at least one of:

an incident angle of the gas relative to the surface of the substrate; and an angle of an ejection direction of the gas from the gas nozzle relative to a radial direction of the substrate when viewed in a direction of the rotation axis of the substrate.

14. The substrate processing apparatus of claim 12, further comprising a controller configured to execute:

ejection of the processing liquid toward the substrate from the processing liquid nozzle;

adjustment of the orientation of the gas nozzle by the gas nozzle direction adjustment mechanism; and ejection of the gas from the gas nozzle with the adjusted orientation of the gas, toward the processing liquid flying between the ejection port of the processing liquid nozzle and the liquid arrival point.

15. The substrate processing apparatus of claim 12, further comprising a controller configured to execute:

ejection of the processing liquid toward the substrate from the processing liquid nozzle;

adjustment of the orientation of the gas nozzle by the gas nozzle direction adjustment mechanism; and ejection of the gas from the gas nozzle with the adjusted orientation of the gas, toward the liquid arrival point of the processing liquid being ejected from the processing liquid nozzle.

16. A substrate processing method comprising:

rotating a substrate around a rotation axis;

ejecting a processing liquid from a processing liquid nozzle to a peripheral portion of the rotating substrate; and ejecting a gas from a gas nozzle toward the processing liquid from a time at which the processing liquid is ejected from an ejection port of the processing liquid nozzle to a time at which the processing liquid arrives at a liquid arrival point on the substrate, wherein a flight trajectory of the processing liquid is changed by the gas ejected through the gas nozzle, and wherein droplets separated from the substrate are blown off to an outside of the substrate in a radial direction by the gas ejected from the gas nozzle.

17. The substrate processing method of claim 16, wherein ejecting the gas comprises spraying the gas to the processing liquid ejected from the ejection port of the processing liquid nozzle before the processing liquid arrives at the liquid arrival point on the substrate, to change a direction of the processing liquid, and when a circle, which is centered on a foot of a perpendicular line drawn from the liquid arrival point to the rotation axis and has a radius corresponding to a line segment connecting the foot and the liquid arrival point, is defined to be located on a plane orthogonal to the rotation axis, when an angle formed between a straight line, which connects a foot of a perpendicular line drawn from the ejection port of the processing liquid nozzle to a surface of the substrate and the liquid arrival point, and a tangential line of the circle at the liquid arrival point is an angle θ, the processing liquid nozzle ejects the processing liquid such that the angle θ becomes a first angle smaller than 90 degrees when the gas is not ejected from the gas nozzle, and the gas nozzle ejects the gas so as to change the direction of the processing liquid such that the angle θ becomes a second angle closer to 90 degrees than the first angle.

18. The substrate processing method of claim 17, wherein, when an angle formed between the straight line connecting the foot of a perpendicular line drawn from the ejection port of the processing liquid nozzle to a surface of the substrate to the liquid arrival point and a straight line connecting the ejection port of the processing liquid nozzle to the liquid arrival point is φ, the processing liquid nozzle ejects the processing liquid such that the angle φ becomes a first angle smaller than 90 degrees when the gas is not ejected from the gas nozzle, and the gas nozzle ejects the gas so as to change the direction of the processing liquid such that the angle φ becomes a second angle closer to 0 degrees than the first angle.

19. The substrate processing method of claim 16, wherein ejecting the gas comprises spraying the gas to the liquid arrival point on the substrate of the processing liquid ejected from the ejection port of the processing liquid nozzle, and when a circle, which is centered on a foot of a perpendicular line drawn from the liquid arrival point to the rotation axis and has a radius corresponding to a line segment connecting the foot and the liquid arrival point, is defined to be located on a plane orthogonal to the rotation axis, when an angle formed between a vector indicating an orientation of a main stream of the processing liquid separated to an outside of the substrate from the liquid arrival point when viewed in a direction of the rotation axis and a tangential line of the circle at the liquid arrival point is an angle θS, the processing liquid nozzle ejects the processing liquid such that the angle θS becomes a first angle smaller than 90 degrees when the gas is not ejected from the gas nozzle, and the gas nozzle ejects the gas so as to change the direction of the processing liquid separated from the liquid arrival point such that the angle θS becomes a second angle closer to 90 degrees than the first angle.

* * * * *